US010991427B2

(12) United States Patent
Strand et al.

(10) Patent No.: US 10,991,427 B2
(45) Date of Patent: *Apr. 27, 2021

(54) MEMORY PROGRAMMING METHODS AND MEMORY SYSTEMS

(71) Applicant: Micron Technology, Inc., Boise, ID (US)

(72) Inventors: Jonathan Strand, Boise, ID (US); Adam Johnson, Meridian, ID (US); Xiaonan Chen, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/422,690

(22) Filed: May 24, 2019

(65) Prior Publication Data
US 2019/0279713 A1    Sep. 12, 2019

Related U.S. Application Data

(63) Continuation of application No. 15/690,744, filed on Aug. 30, 2017, now Pat. No. 10,304,531, which is a
(Continued)

(51) Int. Cl.
G11C 11/00    (2006.01)
G11C 13/00    (2006.01)
(Continued)

(52) U.S. Cl.
CPC ...... *G11C 13/0069* (2013.01); *G11C 13/0002* (2013.01); *G11C 13/0007* (2013.01); *G11C 13/0064* (2013.01); *G11C 29/08* (2013.01); *G11C 29/50008* (2013.01); G11C 13/00 (2013.01); G11C 2013/0073 (2013.01); G11C 2029/0409 (2013.01); G11C 2029/5006 (2013.01)

(58) Field of Classification Search
CPC ............. G11C 13/002; G11C 13/0064; G11C 13/0069; G11C 13/0097
See application file for complete search history.

(56) References Cited

U.S. PATENT DOCUMENTS 6,137,716 A    10/2000 Wik
6,381,670 B1    4/2002 Lee et al.
(Continued)

Primary Examiner — Toan K Le
(74) Attorney, Agent, or Firm — Wells St. John P.S.

(57) ABSTRACT

Memory programming methods and memory systems are described. One example memory programming method includes first applying a first signal to a memory cell to attempt to program the memory cell to a desired state, wherein the first signal corresponds to the desired state, after the first applying, determining that the memory cell failed to place in the desired state, after the determining, second applying a second signal to the memory cell, wherein the second signal corresponds to another state which is different than the desired state, and after the second applying, third applying a third signal to the memory cell to program the memory cell to the desired state, wherein the third signal corresponds to the desired state. Additional method and apparatus are described.

30 Claims, 6 Drawing Sheets

Related U.S. Application Data continuation of application No. 14/987,630, filed on Jan. 4, 2016, now Pat. No. 9,773,551, which is a continuation of application No. 13/658,519, filed on Oct. 23, 2012, now Pat. No. 9,230,685.

(51) Int. Cl.
  *G11C 29/50* (2006.01)
  *G11C 29/08* (2006.01)
  *G11C 29/04* (2006.01)

(56) References Cited

U.S. PATENT DOCUMENTS

| | | | |
|---|---|---|---|
| 6,392,916 | B1 | 5/2002 | Choi et al. |
| 6,879,525 | B2 | 4/2005 | Van Brocklin et al. |
| 7,006,384 | B2 | 2/2006 | Banks |
| 7,206,225 | B2 | 4/2007 | Wu |
| 7,443,220 | B2 | 10/2008 | Tomita |
| 8,467,226 | B2 | 6/2013 | Bedeschi et al. |
| 8,830,753 | B2 | 9/2014 | Kim |
| 8,854,872 | B2 | 10/2014 | Lam et al. |
| 8,923,056 | B2 | 12/2014 | Kim |
| 8,971,088 | B1 | 3/2015 | Jo et al. |
| 9,123,414 | B2 | 9/2015 | Kitagawa et al. |
| 9,230,685 | B2 * | 1/2016 | Strand .................... G11C 29/08 |
| 9,269,432 | B2 | 2/2016 | Faraoni et al. |
| 9,336,875 | B2 | 5/2016 | Fackenthal et al. |
| 9,633,728 | B2 | 4/2017 | Kitagawa et al. |
| 9,773,551 | B2 * | 9/2017 | Strand .................... G11C 29/08 |
| 9,837,151 | B2 | 12/2017 | Fackenthal et al. |
| 10,121,539 | B2 | 11/2018 | Kitagawa et al. |
| 10,147,486 | B2 | 12/2018 | Faraoni et al. |
| 10,176,868 | B2 | 1/2019 | Kitagawa et al. |
| 10,304,531 | B2 * | 5/2019 | Strand .................... G11C 29/08 |
| 10,311,953 | B2 | 6/2019 | Fackenthal et al. |
| 10,770,143 | B2 | 9/2020 | Kitagawa et al. |
| 2006/0245262 | A1 | 11/2006 | Li |
| 2008/0080238 | A1 | 4/2008 | Yuda |
| 2011/0292724 | A1 | 12/2011 | Kim |
| 2011/0310652 | A1 | 12/2011 | Kim et al. |
| 2012/0120711 | A1 | 5/2012 | Rabkin et al. |
| 2012/0230085 | A1 | 9/2012 | Kawai et al. |
| 2012/0236624 | A1 | 9/2012 | Costa et al. |
| 2012/0257455 | A1 | 10/2012 | Oh et al. |
| 2013/0083589 | A1 | 4/2013 | Or-Bach et al. |
| 2013/0094275 | A1 | 4/2013 | Chen |
| 2013/0148409 | A1 | 6/2013 | Chung |
| 2013/0163322 | A1 | 6/2013 | Lam et al. |
| 2013/0201750 | A1 | 8/2013 | Lee et al. |
| 2013/0208528 | A1 | 8/2013 | Kwak et al. |
| 2013/0250654 | A1 | 9/2013 | Sugimae et al. |
| 2013/0250657 | A1 | 9/2013 | Haukness et al. |
| 2014/0112052 | A1 | 4/2014 | Strand et al. |
| 2014/0112054 | A1 | 4/2014 | Shimakawa et al. |
| 2015/0179256 | A1 | 6/2015 | Kitagawa et al. |
| 2016/0118119 | A1 | 4/2016 | Strand et al. |
| 2017/0365539 | A1 | 12/2017 | Meinhold et al. |
| 2019/0066784 | A1 | 2/2019 | Kitagawa et al. |
| 2019/0279714 | A1 | 9/2019 | Fackenthal et al. |

* cited by examiner

MEMORY PROGRAMMING METHODS AND MEMORY SYSTEMS

RELATED PATENT DATA

This application is a continuation of and claims priority to U.S. patent application Ser. No. 15/690,744, filed Aug. 30, 2017, which is a continuation of and claims priority to U.S. patent application Ser. No. 14/987,630, filed Jan. 4, 2016, now U.S. Pat. No. 9,773,551, issued Sep. 26, 2017, which is a continuation of and claims priority to U.S. patent application Ser. No. 13/658,519 filed Oct. 23, 2012, now U.S. Pat. No. 9,230,685, issued Jan. 5, 2016, the teachings of which are incorporated herein by reference.

TECHNICAL FIELD

Embodiments disclosed herein pertain to memory programming methods and memory systems.

BACKGROUND

Memory devices are widely used in electronic devices, such as digital cameras and personal audio players, for storing digital data. Many different types of memory are available, each using a different fundamental technology, and the memory may be volatile or non-volatile memory. Resistive random-access memory (RRAM) is one example of a non-volatile memory.

Referring to FIGS. 1A and 1B, example waveforms are illustrated which may be utilized to alter the contents of resistive random-access memory. In particular, FIGS. 1A and 1B illustrate waveforms which may be utilized to implement write operations of one or more RRAM memory cells of a memory array. FIG. 1A illustrates a waveform 2 which may be used to perform a program (or set) write operation and FIG. 1B illustrates a waveform 4 which may be used to perform an erase (or reset) write operation, respectively.

A verification procedure is implemented in both waveforms 2,4 in the illustrated examples. More specifically, a program or erase pulse (i.e., 1V or −1V, respectively) may be applied to one or more memory cells, and thereafter, a verify pulse may be applied to determine whether the memory cells were correctly written to. If not, subsequent program (or erase) pulses may be applied with increased voltage magnitudes in attempts to correctly write to the memory cells. However, it has been observed that some memory cells may fail to correctly place when the example waveforms of FIGS. 1A and 1B are utilized.

At least some embodiments described below are directed towards methods and apparatus which provide successful placement of an increased number of memory cells during programming compared with some conventional memory programming arrangements.

DETAILED DESCRIPTION OF EXAMPLE EMBODIMENTS

At least some embodiments are directed towards apparatus and methods of programming memory with improved bit placement compared with some conventional techniques. A pulse of a given polarity may be utilized to implement a program write operation while a pulse of an opposite polarity may be utilized to implement an erase write operation in one embodiment. Following application of a program or erase pulse, a verification operation may be performed to determine if any of the bits being programmed did not properly place in a desired state being written. In one embodiment, a pulse of the opposite polarity of a state being written may be applied to the bits which failed to place in desired states to program the bits to an opposite state from the desired state. Thereafter, a pulse having a polarity corresponding to the desired state to be written may again be applied to the bits in another attempt to write the bits to the desired state. The application of the pulses of different polarities may be repeated until the bits properly place in one embodiment.

Figure 2:
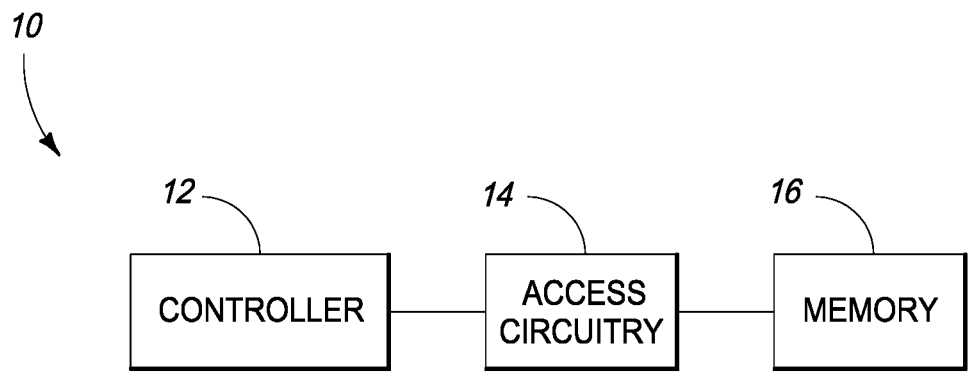
FIG. 2 is a functional block diagram of a memory system according to one embodiment.

Referring to FIG. 2, a functional block diagram of a memory system 10 is shown according to one embodiment. The illustrated memory system 10 includes a controller 12, access circuitry 14, and memory 16. In some embodiments, access circuitry 14 can be located with the controller 12, in memory 16 or upon a separate die from both. In one more specific example embodiment, access circuitry 14 could be a bottom die with a stack of memory devices above it. Other embodiments of memory system 10 are possible and may include more, less and/or alternative components or circuitry.

Memory system 10 may be implemented within or with respect to various associated devices (not shown), such as computers, cameras, media players, and thumb drives, in some examples. Memory system 10 stores data generated or utilized by the associated devices in the described examples.

In one embodiment, controller 12 is configured to process data, control data access and storage, issue commands, and control other desired operations. In one embodiment, controller 12 controls operations of writing, reading and re-writing data of memory 16 as well as interfacing with other components or circuitry, such as sources of data to be stored within memory 16. Controller 12 may access and process commands with respect to memory 16 during operations of an associated device. Example commands instruct the generation of signals including program (set) and erase (reset) pulses which are applied to memory 16 in one embodiment. The program and erase pulses are used to write data to memory in one embodiment, and the application of a program pulse and the application of a erase pulse are both referred to as write operations of memory in one embodiment. As described further below, controller 12 may also implement verification operations during writing of the memory cells to determine whether the memory cells were placed into proper states during the writing.

Controller 12 may comprise processing circuitry configured to execute programming provided by appropriate computer-readable storage media in at least one embodiment. For example, the controller 12 may be implemented as one or more processor(s) and/or other structure configured to execute executable instructions including, for example, software and/or firmware instructions. The programming may be stored within one or more computer-readable storage media of controller 12. The storage media may be non-transitory and be embodied in one or more articles of manufacture. Other example embodiments of controller 12 may include hardware logic, PGA, FPGA, ASIC, state machines, and/or other structures alone or in combination with one or more processor(s). These examples of controller 12 are for illustration and other configurations are possible.

Access circuitry 14 is coupled with controller 12 and memory 16 and is configured to implement addressing (selection of columns and rows of an array of memory 16), writing, reading and re-writing operations with respect to memory 16. For example, access circuitry 14 may receive instructions from controller 12 to select a specific page, word or byte of the memory 16 as well as implement writing, reading and re-writing with respect to a plurality of cells of the selected page, word or byte. As discussed below, the access circuitry 14 may apply electrical pulses to the memory 16 to perform write, read and verification operations in one embodiment.

Memory 16 can include a plurality of memory cells configured to store data, conductors, and perhaps additional circuitry in one embodiment. The memory cells may be configured as volatile or non-volatile cells, and in one specific implementation, the memory cells are resistive random access memory (RRAM) non-volatile cells. The memory cells may be utilized to store data during operations of an associated device (e.g., storing image files generated by an imaging system of an associated camera). The memory cells may be written to different states to store different data at different moments in time in some embodiments. As described further below, if the memory is implemented as RRAM, then the memory cells have different resistances corresponding to different states (e.g., different states corresponding to binary 1s and 0s data).

Figure 3:
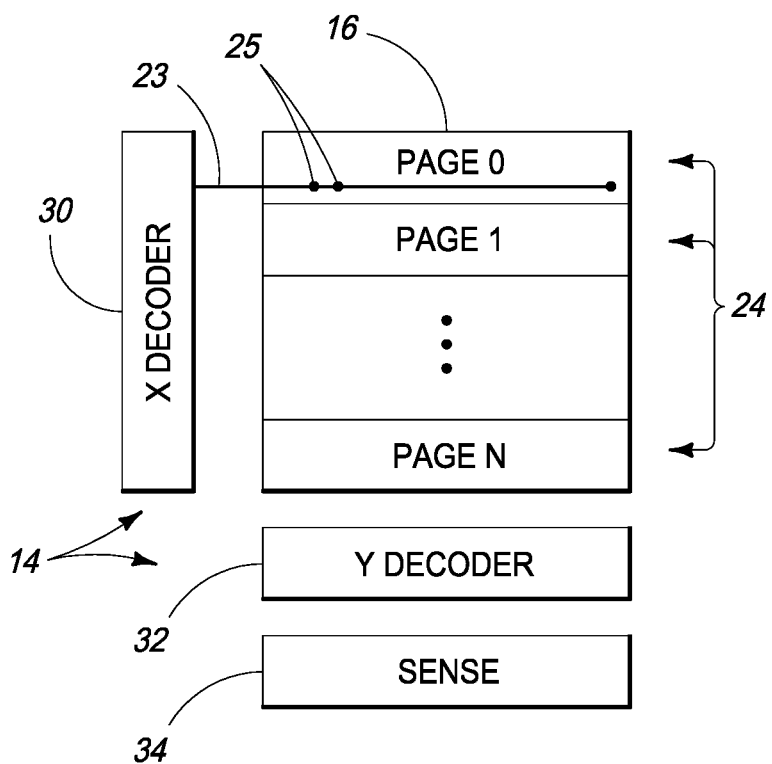
FIG. 3 is a functional block diagram of circuitry of the memory system according to one embodiment.

Referring to FIG. 3, details of one embodiment of access circuitry 14 and memory 16 are shown. In the illustrated embodiment, memory 16 includes a plurality of memory cells 25. In addition, the memory 16 may be arranged as a plurality of pages 24 shown as Page 0-Page N in the illustrated embodiment. Although only Page 0 is shown as including cells 25 (and word line 23), it is to be understood that all pages 24 may include a respective word line 23 and cells 25.

In the illustrated embodiment, access circuitry 14 is implemented as an X decoder 30, a Y decoder 32, and a sense amplifier 34. X and Y decoders 30, 32 and sense amplifier 34 operate to access desired pages 24 and cells 25 for reading, writing and verification of data within the memory cells 25. As described in one embodiment below, the X and Y decoders 30, 32 may apply signals in the form of electronic pulses to the memory 16 to implement writing, reading and verification operations.

As mentioned above, the memory 16 of the embodiment shown in FIG. 2 includes a plurality of pages 24 which correspond to a plurality of rows. In one embodiment, X decoder 30 may select one of the pages 24 for reading, writing and verification of the memory cells 25 of the selected page 24. More specifically, each of the pages 24 may have an associated word line 23 which may be selected by X decoder 30 to activate and enable reading, writing and verification of the memory cells 25 of the selected page 24. In one arrangement, Y decoder 32 determines which ones of the memory cells 25 receive program and erase pulses, respectively. In one embodiment, the memory cells 25 of different pages 24 are arranged with respect to a plurality of columns which are addressable and selected by the Y decoder 32.

In one more specific embodiment, assume the controller 12 is implementing an erase write operation where the contents of a given page 24 of memory 16 (e.g., Page 1) are erased during operations of the associated device in which the memory system 10 is utilized. The X decoder 30 operates to select the word line 23 of the selected page 24 to activate the memory cells 25 of the selected page 24. Following selection of the respective word line 23 for the desired page 24, controller 12 may control the application of one or more erase pulses to appropriate memory cells 25 of memory 16 using Y decoder 32 to erase the desired memory cells 25.

Furthermore, some of the memory cells 25 of memory 16 for the desired page 24 may also receive a program pulse during implementation of a programming write operation. Following assertion of the respective word line 23 for the desired page 24, controller 12 may control the application of the program pulse to appropriate memory cells 25 of memory 16.

In the described example embodiment where the memory 16 is implemented as RRAM, applying pulses of different voltage polarities across terminals of a memory cell 25 changes the resistance of the memory cell 25 and the different resistances correspond to different states (0s and 1s data). Thereafter, during a read operation, a read voltage may be provided across the terminals of the memory cell 25, and the sense amplifier 34 may read the resulting current to determine which of the different resistive states the memory cell 25 has been programmed to.

Figure 4:
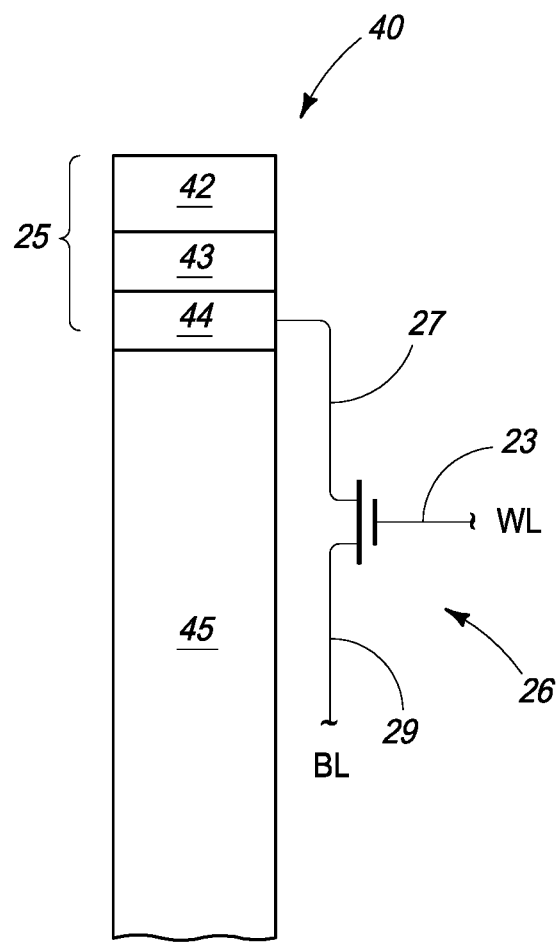
FIG. 4 is a diagrammatic cross-sectional view of a portion of a semiconductor construction of a memory cell according to one embodiment.

Referring to FIG. 4, a fragment 40 of a construction of one of the memory cells 25 is shown coupled with example circuitry according to one embodiment. Other configurations of memory cells 25 and circuitry may be used in other embodiments.

Fragment 40 comprises a base 45 and a memory cell 25 over base 45 in the depicted embodiment. Base 45 may comprise semiconductor material, and in some embodiments may comprise, consist essentially of, or consist of monocrystalline silicon. Other configurations of base 45 are possible. Memory cell 25 comprises a top electrode 42, a memory element 43 and a bottom electrode 44 in the illustrated embodiment. Top and bottom electrodes 42, 44 comprise electrically conductive material and may be referred to as terminals of the memory cell 25 in one embodiment.

In one embodiment, memory cell 25 is a resistive random access memory (RRAM) cell and the memory element 43 changes electrical resistance corresponding to different memory states. In one illustrative example, appropriate voltage biases may be applied across top and bottom electrodes 42, 44 to change the resistance of the memory element 43. In more specific examples, the memory cell 25 may be a programmable metallization cell (PMC) or a conductive-bridging random access memory (CBRAM) cell. The application of different voltage biases across the memory element 43 causes changes to one or more metal filaments formed within memory element 43 and which cause associated changes in the resistance of the memory element 43 in these example embodiments. Other constructions of memory cell 25 are possible.

In one embodiment, in a program (set) state, memory element 43 of memory cell 25 has a relatively low electrical resistance, while in an erase (reset) state, memory element 43 of memory cell 25 has a relatively high electrical resistance. The low and high resistive states correspond to different values of digital information in one embodiment. The memory cell 25 may be programmed to the different resistive states at different moments in time.

In addition, circuitry in the form of an access transistor 26 is shown coupled with the memory cell 25 in the example of FIG. 4. In this illustrated example, access transistor 26 is implemented as a field effect transistor (FET) with a gate coupled with wordline 23, a drain 27 connected with bottom electrode 44 of the memory cell 25 and a source 29 coupled with a bitline (i.e., the bitline may be coupled with a plurality of access transistors for memory cells of a given column of a memory array in one embodiment). The wordline 23 may be coupled with the gates of other access transistors for all bits in a row of the memory array in one embodiment. Current drivers (source/sink) may be connected to the top electrode 42 and the bitlines of the memory array in one configuration.

In one embodiment, top electrode 42 is connected to a common plate or electoral node shared by a plurality of other memory cells (not shown) of a memory array. In one example for implementing a program (set) operation, the top electrode 42 may be held at a relatively low voltage bias while transistor 26 is off (i.e., the gate is low). The bitline 29 may be set to a relatively low voltage bias corresponding to or the same as the bias of top electrode 42. The wordline 23 connected with gate 23 may be brought to a desired bias level to turn transistor 26 on, however, no current flows through memory cell 25 since the top and bottom electrodes 42, 44 are at substantially the same bias potential.

Thereafter, to perform the program (set) write operation, the voltage of the bitline 29 may be increased to apply the desired voltage bias across the selected memory cell 25 for a given amount of time during which current flows through the memory cell 25 and provides the memory cell 25 in the desired program (set) resistive state. The amount of current flow between the electrodes 42, 44 may be determined by a number of factors including the total bias between the top electrode 42 and the bitline 29, the bias of the gate of access transistor 26, the resistance of the memory cell 25 and potentially the controller 12 and access circuitry 14.

After application of the pulse to implement the program (set) write operation, the wordline and gate 23 are biased low and the bitline bias returns to the bias of the top electrode 42. The order of transitioning of the wordline and bitline may vary for both the start and end of the pulse in different embodiments.

In an example for implementing an erase (reset) write operation of the memory cell 25, top electrode 42 is placed at a relatively high voltage bias and the voltage bias of the bitline may be lowered below the bias of top electrode 42 to cause current to flow through the memory cell 25 to program the memory cell 25 to an erase (reset) state.

The discussion of the application of the pulses for implementing program (set) and erase (reset) write operations and the relative biasing applied to the memory cell 25 are illustrative and other implementations are possible. More specifically, memory cell 25 is bipolar in the illustrated example embodiment and voltage biases may be selectively lowered or raised at each of the top electrode 42 and bitline to provide appropriate relative voltage biasing to implement write, read and verify operations.

More specifically, read operations may be performed by applying different voltage biases to the top electrode 42 and bitline and measuring the amount of current flowing through the memory cell 25 which indicates the state of the memory cell 25 in one embodiment. In one embodiment, the read pulses which are applied provide reduced voltage potentials across the memory cell 25 compared with the write pulses (e.g., 10× less voltage potential in one example). As discussed herein, verify pulses are also applied to the memory cell 25 to implement the verification operations and may be substantially the same as the read pulses in one embodiment.

Figure 5A:
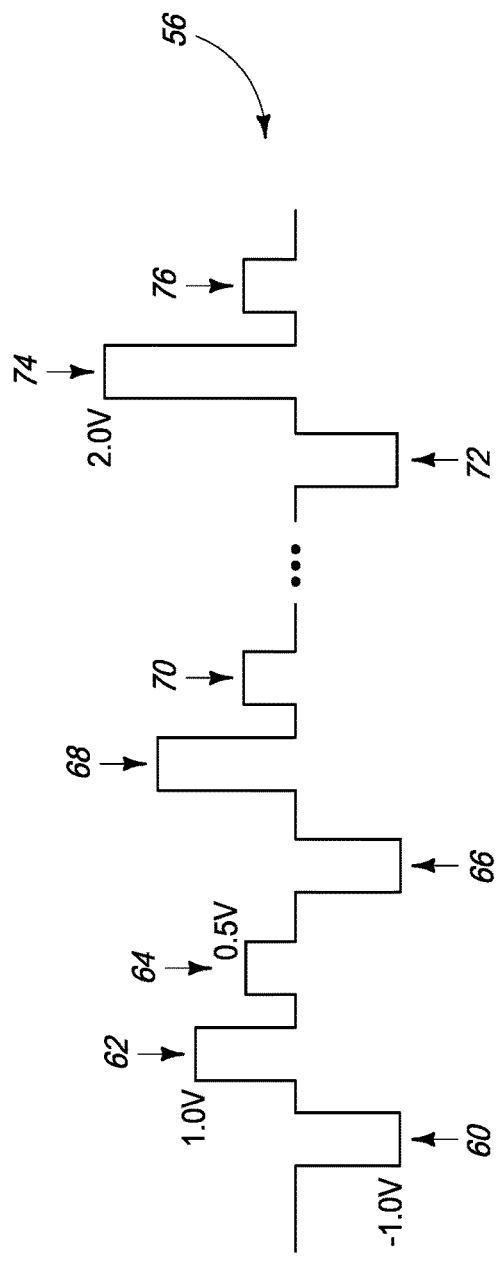
FIG. 5A is a waveform which may be used to implement a program write operation according to one embodiment.
Figure 5B:
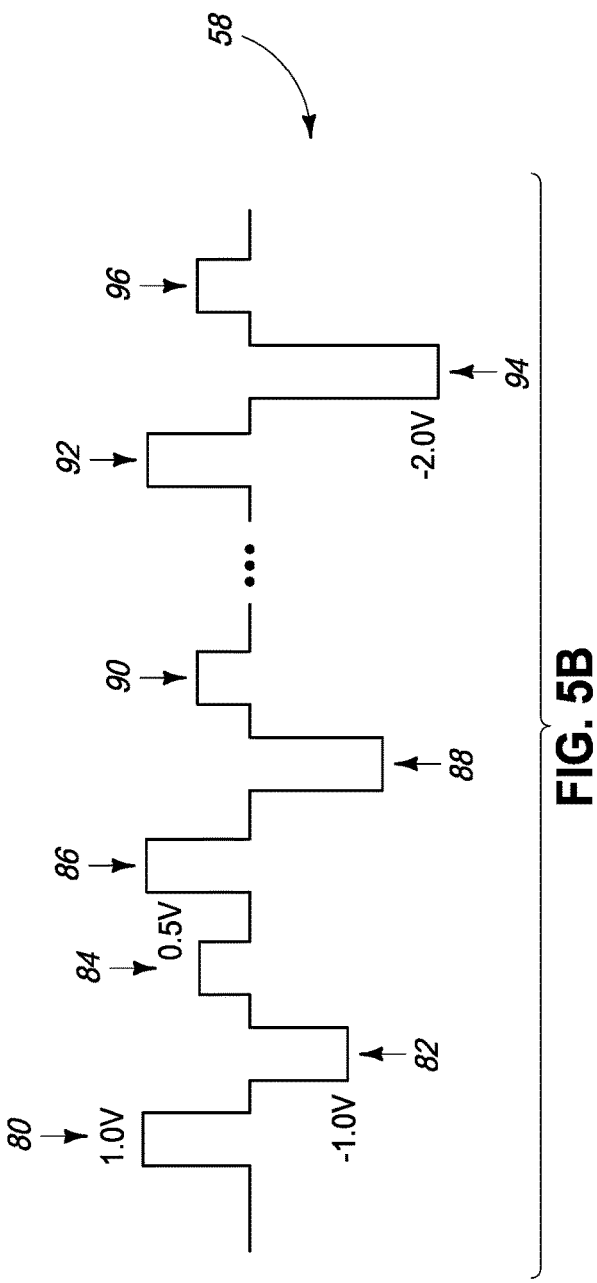
FIG. 5B is a waveform which may be used to implement an erase write operation according to one embodiment.

Referring to FIGS. 5A and 5B, example waveforms 56, 58 are shown for implementing program and erase write operations, respectively. Controller 12 may control the generation of the desired waveforms 56, 58 in one embodiment. Other waveforms may be utilized in other embodiments for programming or erasing memory cells.

Referring to FIG. 5A, a plurality of electrical pulses are shown for implementing a program write operation with respect to a memory cell according to one embodiment. Although positive voltage pulses are used to provide the memory cell with the desired program state (desired resistance), an initial pulse 60 having an opposite polarity (negative) may be initially applied to the selected memory cell following a command or indication to initiate a program write operation with respect to the given memory cell in one embodiment.

Thereafter, a first program pulse 62 may be applied to the memory cell to attempt to provide the memory cell in the desired program state. Following the application of the first program pulse 62, a verification operation may be implemented to determine whether the memory cell placed in the appropriate state (i.e., program state). More specifically, a first verification pulse 64 may be applied to the memory cell and the resultant current may be measured by the sense amplifier 34 and the resultant measurement may be analyzed by controller 12 (e.g., compared with a threshold) to determine whether the memory cell has been placed in the desired state to implement the verification operation.

If the verification procedure determined that the memory cell placed in the appropriate state from the application of the program pulse 62, then the write operation with respect to the memory cell may cease.

In the illustrated example, and following the failure of the memory cell to be placed in the desired state, the controller 12 may control the application of another pulse 66 having a voltage polarity opposite to the program pulse 62 to the appropriate memory cell to place the memory cell in the opposite state (i.e., erase state). Thereafter, the controller 12 may control the application of another program pulse 68 to the appropriate memory cell to again attempt to place the memory cell within the appropriate desired state.

In one embodiment, the controller 12 may change one or more characteristic of the second program pulse 68 compared with the first program pulse 62. For example, the controller 12 may vary the pulse amplitude, timing and/or shape of the program pulses 62, 68, 74 from one another. In the illustrated embodiment of FIG. 5A, program pulse 62 has a voltage of 1.0 V and a step voltage of 100 mV may be used to provide program pulse 68 with a voltage of 1.1 V. Pulse 74 has a stop voltage of 2.0 V in the described example waveform. The program pulses 62, 68, 74 individually have a pulse width of 10 us and the verify pulses 64, 70, 76 have a magnitude of 500 mV in the illustrated example embodiment. Furthermore, a threshold of 100 nA may be utilized to determine if a memory cell has properly placed in one embodiment Other pulses of different shapes and/or voltages may be used in other embodiments.

In one embodiment, the application of pulses having polarities corresponding to a state which is different than the desired state (i.e., program state) and the following program pulses may be repeated until the memory cell has been properly placed in the desired state as determined using one of the verification pulses. Once the memory cell has been determined to be placed in the desired program state, the programming write operation with respect to writing the memory cell to the program state may be ceased. In the illustrated example, additional program pulses may be applied until pulse 74 having a stop voltage 2.0V is applied. The write program operation with respect to the memory cell may be ceased if the memory cell fails to appropriately place after the application of pulse 74 in one embodiment.

Furthermore, the write operation may also be terminated with respect to the memory cell prior to the memory cell being appropriately written to the desired state and prior to the application of pulse 74 in some embodiments. For example, the memory system 10 may be utilized in a certain application having timing or other constraints or requirements where there is insufficient time for the application of all the program pulses 62, 68, 74.

Certain memory cells which fail to correctly place following a write operation may be masked and not used for subsequent storage operations in one embodiment. In addition, an entire row or column may also be identified as faulty and not subsequently utilized to store data as a result of a number of the memory cells of the row or column failing to correctly place during an appropriate write operation.

Furthermore, in one embodiment, the subsequent program pulses 68, 74 may only be applied to the memory cells of a given row which failed to correctly place into the desired program state. More specifically, if a first memory cell of a given row correctly places during the application of pulse 62 and a second memory cell of the row does not correctly place during the application of pulse 62, then pulses 68, 74 may only be applied to the second memory cell and not the first memory cell in one embodiment.

In one embodiment discussed below with respect to FIG. 6, a verification operation may be performed with respect to one or more memory cells following an instruction to write the one or more memory cells to a desired state. More specifically, if the verification operation indicates that the one or more memory cells are already in the desired state to be written, then the write operation is not performed with respect to such memory cells already having the desired state but rather may only be performed with respect to the one or more memory cells which are not in the desired state to be written.

Referring to FIG. 5B, a plurality of electrical pulses are shown for implementing an erase write operation according to one embodiment. Although negative voltage pulses are used to provide the memory cell with the desired erase state (desired resistance), an initial pulse 80 having an opposite polarity (positive) may be initially applied to the selected memory cell following an instruction to initiate an erase write operation with respect to the given memory cell.

Thereafter, a first erase pulse 82 may be applied to the memory cell to attempt to provide the memory cell in the desired erase state. Following the application of the first erase pulse 82, a verification operation may be implemented to determine whether the memory cell placed in the appropriate state (i.e., erase state). More specifically, a first verification pulse 84 may be applied to the memory cell and the resultant current may be measured by the sense amplifier 34 and the resultant measurement analyzed by controller 12 (e.g., compared with a threshold) to determine whether the memory cell has been placed in the desired state to implement the verification operation.

In the illustrated example, and following the failure of the memory cell to be placed in the desired state, the controller 12 may control the application of another pulse 86 having a voltage polarity opposite to the erase pulse 82 to the appropriate memory cell to place the memory cell in the opposite state (i.e., program state). Thereafter, the controller 12 may control the application of another erase pulse 88 to the appropriate memory cell to again attempt to place the memory cell within the appropriate desired state.

As mentioned above with respect to FIG. 5A, the controller 12 may change one or more characteristic of the second erase pulse 88 compared with the first erase pulse 82. For example, the controller 12 may vary the pulse amplitude, timing and/or shape of the erase pulses 82, 88, 94. In the illustrated embodiment of FIG. 5B, erase pulse 82 has a voltage of −1.0 V and a step voltage of −100 mV may be used to provide erase pulse 68 with a voltage of −1.1 V. Pulse 94 has a stop voltage of −2.0 V in the described example waveform. The erase pulses 82, 88, 94 individually have a pulse width of 10 us and the verify pulses 84, 90, 96 have a magnitude of 500 mV in the illustrated example embodiment. Furthermore, a threshold of 100 nA may be utilized to determine if a memory cell has properly placed in one embodiment.

In one embodiment, the application of waveform 56 including plural programming pulses 62, 68, 74 may be referred to as a single program write operation with respect to a memory cell and the application of waveform 58 including plural erase pulses 82, 88, 94 may be referred to as a single erase write operation with respect to a memory cell.

Figure 6:
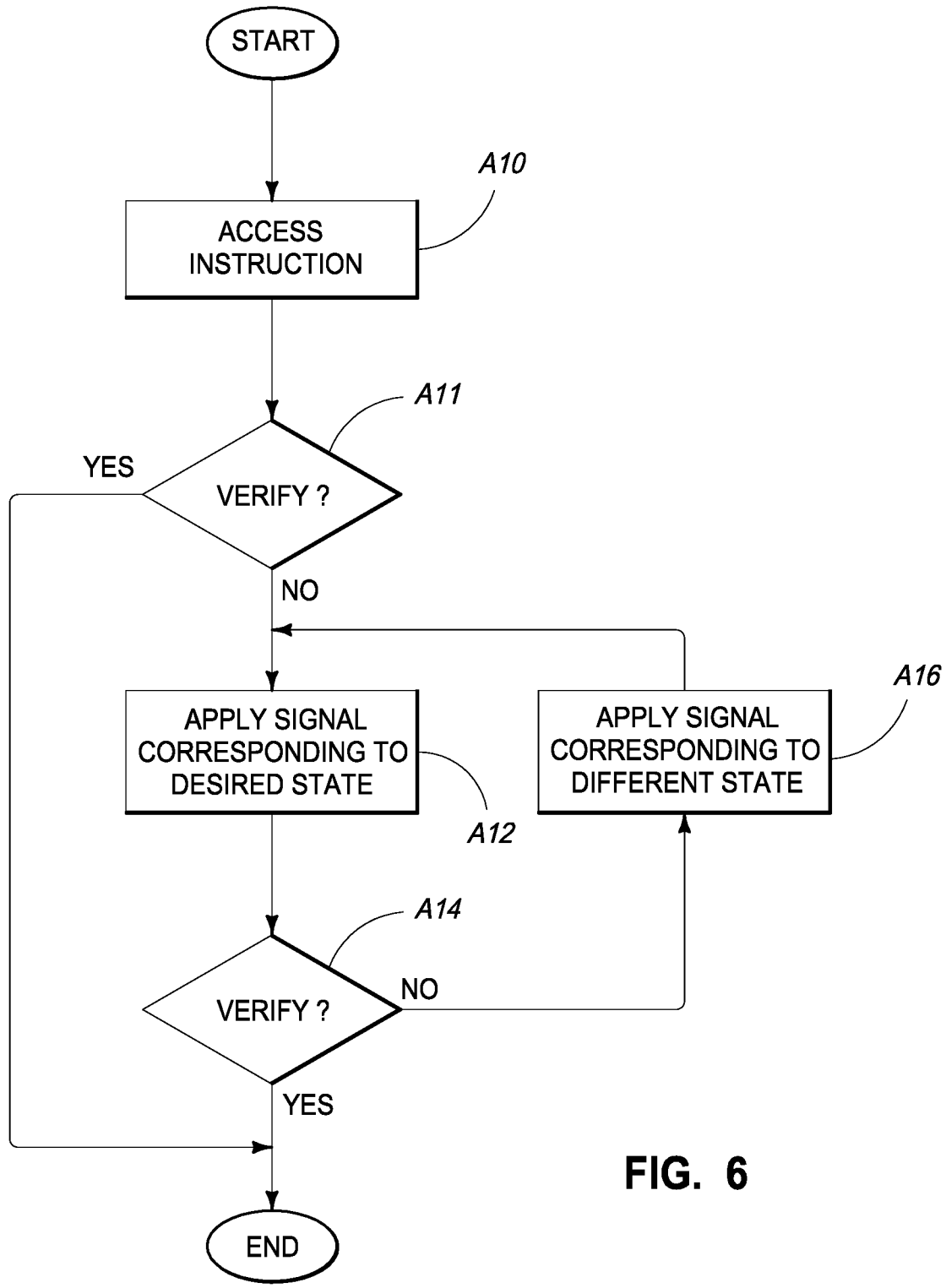
FIG. 6 is a flow chart of a method which may be used to program a memory cell according to one embodiment.

Referring to FIG. 6, an interleaved method of implementing a single write operation (e.g., program or erase) with respect to a given memory cell is shown. The method may be implemented by controller 12 in one embodiment. Other methods are possible including more, less and/or alternative acts.

At an act A10, the controller of the memory system accesses an instruction from an external circuit (e.g., camera controller). The instruction may instruct that one or memory cells be programmed to a desired state corresponding to a desired value of digital information. For example, the instruction may instruct that a write operation for the desired state be performed with respect to one or more memory cells of the memory array.

At an act A11, as a result of the accessing the instruction, the controller may perform a verification operation with respect to the one or more memory cells to be programmed to determine the states of the cells. In one embodiment, the controller provides a verification pulse to the one or more memory cells and the resultant currents of the one or more memory cells may be compared to a threshold to determine whether the one or more memory cells have a resistance corresponding to the desired state of the instruction. The method ends with respect to the one or more memory cells if the one or more cells are already in the desired state as determined by the verification operation in one embodiment. The method proceeds to act A12 with respect to the one or more memory cells which are not in the desired state as determined by the verification operation of act A11 in the described embodiment.

At an act A12, the controller may apply a signal (e.g., pulse having a voltage polarity for a program write operation) to one or more memory cells to attempt to write the one or more memory cells to a desired state (e.g., program state). The application of the signal attempts to provide the one or more memory cells with a resistance corresponding to the desired state.

In another embodiment, a pulse having a polarity which is opposite to the desired state (e.g., erase pulse) may be applied to the one or more memory cells prior to the application of the first program pulse as described above with respect to FIGS. 5A and 5B.

At an act A14, the controller provides a verification pulse to the one or more memory cells and the resultant currents of the one or more memory cells may be compared to a threshold to determine whether the one or more memory cells have the resistance corresponding to the desired state indicating proper placement. The method ends with respect to the one or more memory cells which properly placed in one embodiment. For example, the cells being programmed may be addressable by a common wordline and subsequently applied pulses described below with respect to act A16 may only be applied to the cells of the wordline which failed to properly place and the remaining cells which properly placed may be isolated from the subsequently applied pulses using appropriate control of the bitlines.

At an act A16, the controller applies a signal which corresponds to a different state than the desired state being programmed to the one or memory cells which failed to correctly place. For example, if a program write operation is being performed, the controller may apply an erase pulse (i.e., a pulse having a voltage polarity opposite to a program pulse) to the memory cells which failed to appropriately place. The memory cells may have a resistance which corresponds to the different state (i.e., erase state) and which is different than the resistance of the cells placed in the desired state following the application of the erase pulse.

Thereafter, the controller returns to act A12 to again apply a pulse to the one or more cells which failed to properly place and which corresponds to the desired state to be programmed (e.g., program state). In one embodiment, a characteristic (e.g., magnitude, pulse width, shape) of the pulse applied at act A12 during the second iteration of the method may be varied compared with the pulse applied at act A12 during the first iteration of the method. The signal is applied in act A12 to attempt to change the resistance of the memory cell from a value corresponding to the erase state following the application of the signal in act A16 to a resistance value which corresponds to the desired program state in one embodiment.

In one embodiment, the method repeats acts A12, A14, A16 until the memory cells have been properly placed, a timing requirement has been exceeded, or the method otherwise ends. As discussed earlier, any memory cells which fail to properly place may be identified as faulty and not thereafter used in one embodiment.

Figure 7:
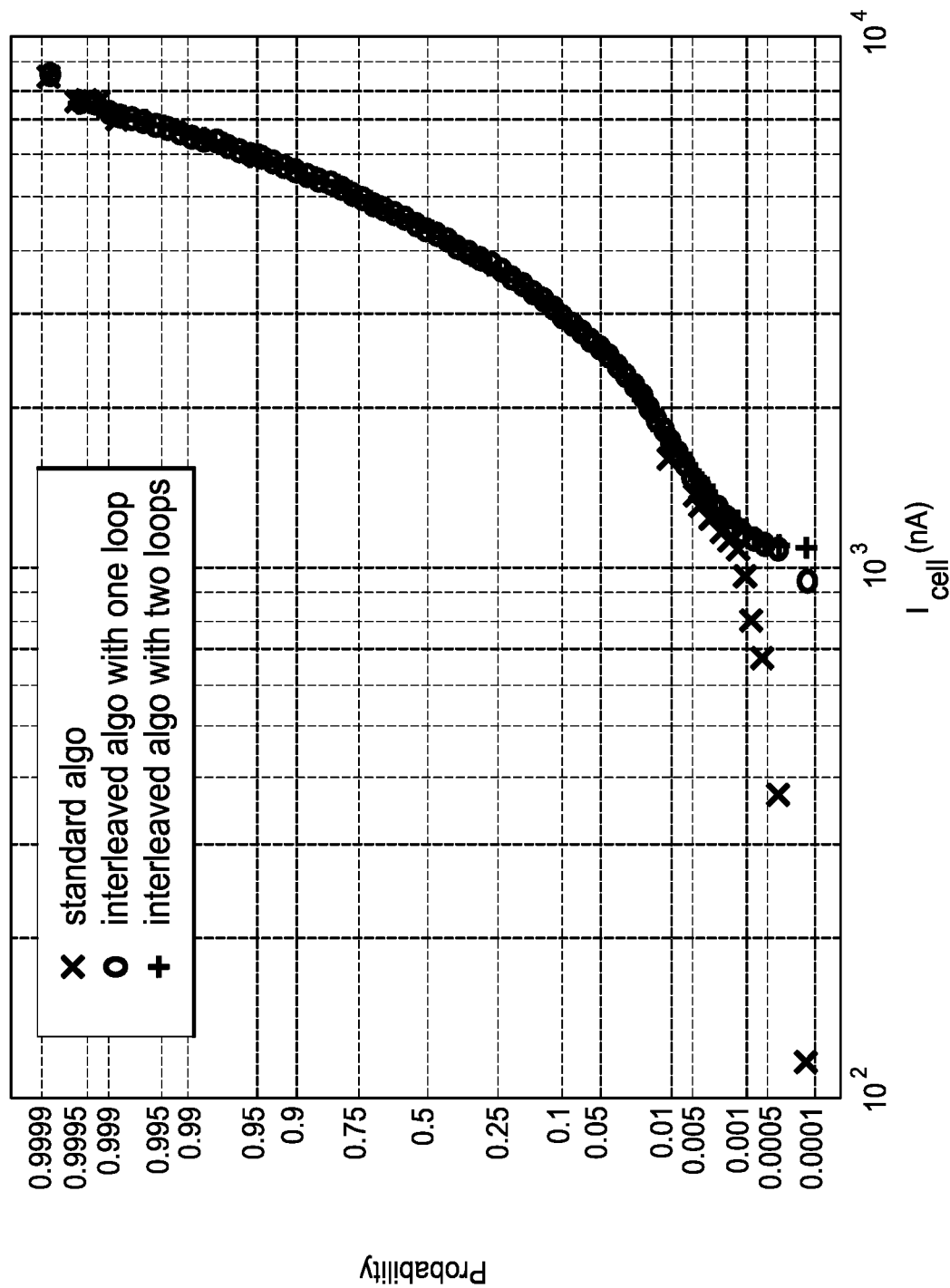
FIG. 7 is a graphical representation of cell current distribution using a conventional programming method and an example programming method according to one embodiment.

Referring to FIG. 7, a graphical representation of cell current distribution for 4 kb RRAM cells after issuance of a program (set) operation corresponding to a low resistance state is shown. In the illustrated example, a threshold of 1000 nA may be utilized to determine whether memory cells have been properly placed.

Figure 1A:
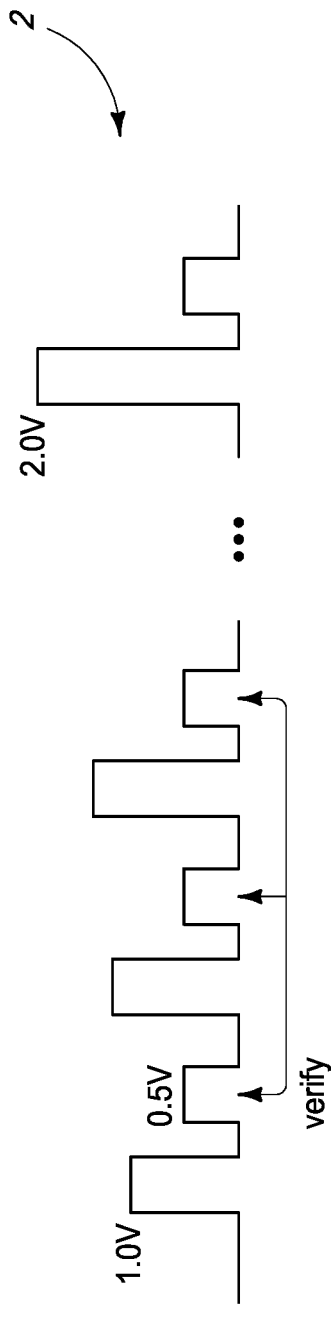
FIG. 1A is a conventional waveform which may be used to implement a program write operation.
Figure 1B:
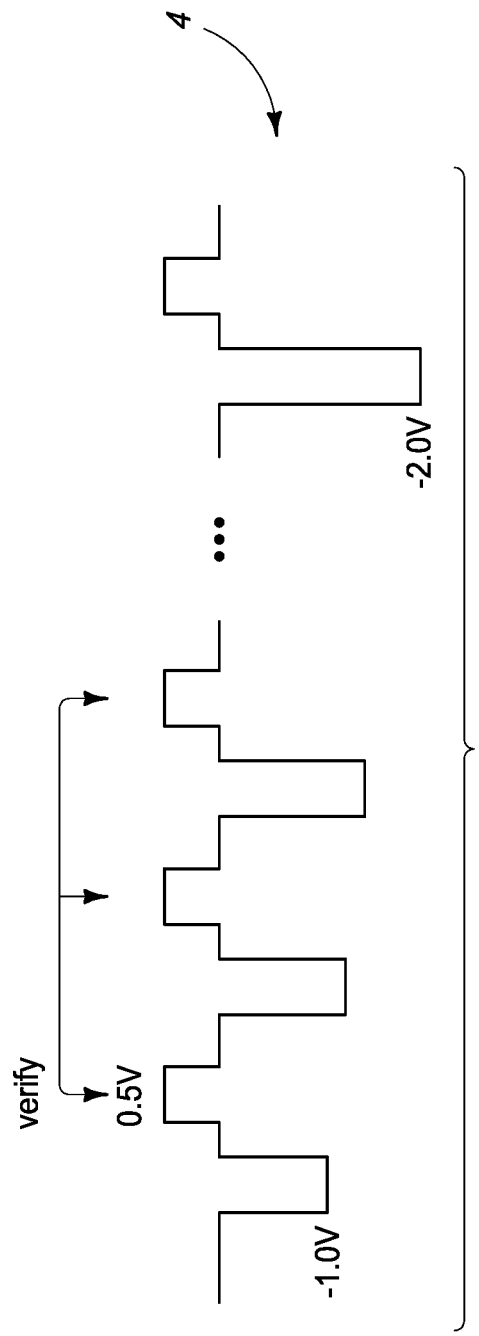
FIG. 1B is a conventional waveform which may be used to implement an erase write operation.

In the illustrated graph, X's represent an arrangement where a conventional waveform 2 of FIG. 1A has been used. As shown, the current of some of the memory cells is less than the threshold indicating that the respective memory cells failed to place in the correct state.

The O's represent the results where one interleaved loop of the flow chart of FIG. 6 has been performed with respect to the memory cells which failed to place after the application of the first program pulse (i.e., one interleaved loop has been performed where two program pulses have been applied with an erase pulse applied between the two program pulses) in accordance with one embodiment. As shown, a reduced number of memory cells failed to place with one interleaved loop of the flow chart compared with the usage of the conventional waveforms.

The +'s represent the results where two interleaved loops of the flow chart have been performed with respect to the memory cells which failed to place after the application of two program pulses (i.e., two interleaved loops where three program pulses have been applied with two erase pulses applied between the three program pulses) in accordance with one embodiment. As shown, none of the memory cells failed to place with two interleaved loops of the flow chart.

CONCLUSION

In some embodiments, a memory programming method comprises first applying a first signal to a memory cell to attempt to program the memory cell to a desired state, wherein the first signal corresponds to the desired state, after the first applying, determining that the memory cell failed to place in the desired state, after the determining, second applying a second signal to the memory cell, wherein the second signal corresponds to another state which is different than the desired state, and after the second applying, third applying a third signal to the memory cell to program the memory cell to the desired state, wherein the third signal corresponds to the desired state.

In some embodiments, a memory programming method comprises accessing an instruction to program a memory cell to a desired state corresponding to a desired value of digital information, and as a result of the accessing, applying a plurality of different signals to the memory cell to program the memory cell to the desired state including applying a plurality of signals which correspond to the desired state and applying at least one of the signals which corresponds to another state which is different than the desired state.

In some embodiments, a memory programming method comprises accessing an instruction to program a memory cell to a desired one of a plurality of different states which correspond to different values of digital information, wherein the memory cell has a plurality of different resistances corresponding to respective ones of the different states and as a result of the accessing, applying a plurality of different signals to the memory cell to provide the memory cell with the different resistances including one of the resistances which corresponds to the desired state.

In some embodiments, a memory system comprises a memory array comprising a plurality of memory cells and circuitry configured to access an instruction which instructs programming one of the memory cells to a desired one of a plurality of different states and as a result of the accessing the instruction, apply a plurality of signals to the one memory cell at different moments in time to provide the one memory cell in the desired state.

In some embodiments, a memory system comprises a memory array comprising a plurality of memory cells, wherein individual ones of the memory cells comprises a plurality of terminals and a memory component intermediate the terminals and wherein the memory component has a plurality of different resistances which correspond to a plurality of different states, and circuitry configured to access an instruction which instructs programming one of the memory cells to one of the different states of the one memory cell and to program the one memory cell to the one state comprising: providing a first signal which corresponds to the one state across the terminals of the one memory cell at a first moment in time, providing a second signal which corresponds to a state which is different than the one state across the terminals of the one memory cell at a second moment in time after the first moment in time, and providing a third signal which corresponds to the one state across the terminals of the one memory cell at a third moment in time after the second moment in time.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory system comprising:
    a plurality of memory cells individually comprising:
        a memory element configured to have a plurality of different memory states at a plurality of different moments in time;
        first and second electrodes configured to apply a plurality of different voltage potentials across the memory element of the respective memory cell to change the memory element of the respective memory cell from a first of the memory states to a second of the memory states; and
    a plurality of access devices configured to apply different bias voltages to the second electrodes of respective ones of the memory cells during the application of the voltage potentials across the memory elements of the respective memory cells.

2. The memory system of claim 1 wherein the first electrodes of the memory cells are provided at common voltage biases with respect to one another during the application of the voltage potentials across the memory elements.

3. The memory system of claim 1 further comprising a common conductor that comprises the first electrodes of the memory cells.

4. The memory system of claim 1 wherein the first electrodes of the memory cells are directly electrically connected with one another.

5. The memory system of claim 1 wherein the memory elements of the memory cells are configured to have different electrical resistances corresponding to the memory states.

6. The memory system of claim 1 wherein the first and second electrodes of an individual memory cell apply the voltage potentials having opposite polarities across the memory element of the respective memory cell to change the memory element of the respective memory cell from the first memory state to the second memory state.

7. The memory system of claim 6 wherein the first and second electrodes of the individual memory cell apply the voltage potentials of one polarity having increasing magnitudes over time and apply the voltage potentials of another polarity having substantially the same magnitude over time.

8. The memory system of claim 1 wherein the first and second electrodes of an individual memory cell apply the voltages potentials having the same polarity and increasing magnitudes over time across the memory element of the respective memory cell to change the memory element of the respective memory cell from the first memory state to the second memory state.

9. The memory system of claim 1 further comprising a controller coupled with the access devices, and wherein the controller is configured to control the operation of the access devices between conductive and non-conductive states to apply the bias voltages to the second electrodes.

10. The memory system of claim 1 wherein the access devices are configured to selectively apply the bias voltages from a plurality of bit lines to the second electrodes.

11. A memory system comprising:
    a plurality of memory cells individually comprising a memory element configured to have a plurality of different memory states at a plurality of different moments in time;
    access circuitry coupled with the memory cells and configured to apply a plurality of initial signals to the memory cells to attempt to change the memory cells from a first of the memory states to a second of the memory states;
    a controller configured to control the access circuitry to apply the initial signals to the memory cells, and wherein the controller is further configured to:
        identify one of the memory cells that failed to change to the second memory state after the application of the initial signals to the memory cells; and
        control the access circuitry to apply an additional signal to the one memory cell to attempt to change the one memory cell to the second memory state and to not apply additional signals to others of the memory cells that changed to the second memory state after the application of the initial signals to the memory cells.

12. The memory system of claim 11 wherein the memory cells individually comprise a plurality of electrodes, and the access circuitry comprises a plurality of access devices which are individually coupled with one of the electrodes of a respective one of the memory cells.

13. The memory system of claim 11 wherein the memory cells individually comprise a plurality of electrodes, and further comprising a common conductor that comprises one of the electrodes of each of the memory cells.

14. The memory system of claim 11 wherein the controller is configured to control the access circuitry to apply an additional signal to an additional memory cell that failed to change to the second memory state after the application of the initial signals to the memory cells.

15. The memory system of claim 11 wherein the memory elements of the memory cells are configured to have different electrical resistances corresponding to the different memory states.

16. The memory system of claim 11 wherein the additional signal has an increased electrical characteristic compared with the initial signals.

17. A memory system comprising:
    a plurality of memory cells individually comprising a memory element configured to have a plurality of different memory states at a plurality of different moments in time; and
    a controller configured to:
        control an application of a plurality of initial signals to the memory cells to attempt to change the memory cells from a first of the memory states to a second of the memory states;

identify one of the memory cells that failed to change to the second memory state after the application of the initial signals to the memory cells;

after the identification, control an application of a plurality of additional signals to the one memory cell to attempt to change the one memory cell to the second memory state, wherein the additional signals have an increased electrical characteristic compared with the initial signals; and cease the application of the additional signals as a result of one of the additional signals having a maximum value of the electrical characteristic.

18. The memory system of claim 17 wherein the electrical characteristic is voltage magnitude.

19. The memory system of claim 17 wherein the memory cells individually comprise a plurality of electrodes, and further comprising a plurality of access devices which are individually coupled with one of the electrodes of a respective one of the memory cells.

20. The memory system of claim 17 wherein the memory cells individually comprise a plurality of electrodes, and further comprising a common conductor that comprises one of the electrodes of each of the memory cells.

21. The memory system of claim 17 wherein the memory elements of the memory cells are configured to have different electrical resistances corresponding to the memory states.

22. The memory system of claim 17 wherein the controller is configured to isolate others of the memory cells from the additional signals, and wherein the other memory cells changed to the second memory state after the application of the initial signals.

23. A memory system comprising:
a plurality of memory cells individually comprising a memory element configured to have a plurality of different memory states at a plurality of different moments in time; and
a controller configured to:
control an application of a plurality of initial signals to the memory cells to attempt to change the memory cells from a first of the memory states to a second of the memory states;

identify one of the memory cells that failed to change to the second memory state after the application of the initial signals to the memory cells;

after the identification, control an application of a plurality of additional signals to the one memory cell to attempt to change the one memory cell to the second memory state; and cease the application of the additional signals as a result of expiration of time.

24. The memory system of claim 23 wherein the additional signals have an increased electrical characteristic compared with the initial signals.

25. The memory system of claim 24 wherein the electrical characteristic is voltage magnitude.

26. The memory system of claim 24 wherein the controller is configured to cease the application of the additional signals as a result of one of the additional signals having a maximum value of the electrical characteristic.

27. The memory system of claim 23 wherein the memory cells individually comprise a plurality of electrodes, and further comprising a plurality of access devices which are individually coupled with one of the electrodes of a respective one of the memory cells.

28. The memory system of claim 23 wherein the memory cells individually comprise a plurality of electrodes, and further comprising a common conductor that comprises one of the electrodes of each of the memory cells.

29. The memory system of claim 23 wherein the memory elements of the memory cells are configured to have different electrical resistances corresponding to the different memory states.

30. The memory system of claim 23 wherein the controller is configured to isolate others of the memory cells from the additional signals, and wherein the other memory cells changed to the second memory state after the application of the initial signals.

* * * * *